United States Patent
Fowler et al.

(10) Patent No.: US 6,477,214 B1
(45) Date of Patent: Nov. 5, 2002

(54) PHASE-BASED FREQUENCY ESTIMATION USING FILTER BANKS

(75) Inventors: Mark L. Fowler, Ithaca, NY (US); James A. Johnson, Newark Valley, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/244,458

(22) Filed: Feb. 4, 1999

(51) Int. Cl.[7] .................................. H04B 1/10
(52) U.S. Cl. .......................... 375/350; 455/303
(58) Field of Search ........................ 375/316, 340, 375/344, 345, 346, 349, 350, 362, 371; 708/300, 309; 455/303, 307

(56) References Cited

U.S. PATENT DOCUMENTS

| | | |
|---|---|---|
| 4,791,600 A | 12/1988 | Jenq |
| 5,488,374 A | 1/1996 | Frankot et al. |
| 5,495,256 A | 2/1996 | Piper |
| 5,517,529 A | 5/1996 | Stehlik |
| 5,532,700 A | 7/1996 | Lockwood |
| 5,548,543 A | 8/1996 | Wang |
| 5,604,503 A | 2/1997 | Fowler et al. |
| 6,085,077 A * | 7/2000 | Fields et al. .............. 455/303 |
| 6,295,325 B1 * | 9/2001 | Farrow et al. ............. 375/327 |

* cited by examiner

*Primary Examiner*—Jean Corrielus
(74) *Attorney, Agent, or Firm*—Whitham, Curtis & Christofferson, P.C.

(57) ABSTRACT

A phase-based approach to estimating the frequency of complex sinusoids in the presence of noise that simultaneously reduces the threshold level and makes it frequency-independent. The approach relies on a filter bank approach: apply the signal to a highly overlapped, four-channel filter bank, detect which channel the signal is in, and apply a phase-based frequency estimation technique to the selected channel output. The computational complexity of the method is kept low by deriving a closed form for the resulting estimator and showing that it leads to an inherent decimation. Further improvement in performance can be obtained by cascading several stages of the four-channel filter bank; the performance tends toward that of the ML method as the number of stages increases.

33 Claims, 11 Drawing Sheets

Spectra of a signal and its threee heterodyned versions

PHASE-BASED FREQUENCY ESTIMATION USING FILTER BANKS

BACKGROUND OF THE INVENTION

1. Field of the Invention

The present invention generally relates to estimating the frequency of a sinusoid in noise, and in particular to phase-based approaches to frequency estimation.

2. Background Description

The problem of estimating the frequency of a sinusoid in noise arises in many areas of applied signal processing. It is typically studied by considering a sequence of N samples of a complex sinusoid plus complex white Gaussian noise given by $$y_1(n) = Ae^{j(\omega_0 n + \theta)} + v(n), \quad n = 1, 2, 3 \ldots, N, \quad (1)$$

where the amplitude A>0, the frequency $\omega_o \in (-\pi, \pi]$ radians/sample, and the phase $\theta \in [0, 2\pi)$ are unknown constants, and the v(n) are samples of a complex-valued, white, zero mean Gaussian noise sequence whose real and imaginary components are uncorrelated and each has variance $\sigma^2/2$ so that v(n) has variance $\sigma^2$. The signal-to-noise ratio (SNR) of the problem is defined to be SNR=$A^2/\sigma^2$. The performance of a frequency estimator is typically compared to the Cramer-Rao bound (CRB) for frequency estimation, which is given by $$\sigma_{\omega_0}^2 \geq \frac{6}{N(N^2-1)SNR}. \quad (2)$$

Frequency estimation techniques typically suffer from a threshold effect, where for SNRs above the threshold the variance of the estimate attains the CRB, while for SNRs below the threshold the variance of the estimate rapidly increases. The particular SNR value where this threshold occurs depends on the particular estimation technique. For example, the maximum likelihood estimate (MLE) of frequency achieves the CRB, but only when the SNR is above a certain threshold (see D. C. Rife and R. R. Boorstyn, "Single-tone parameter estimation from discrete-time observations," IEEE Trans. Inform. Theory, vol. IT-20, pp. 591–598, September 1974, hereinafter Rife and Boorstyn). Although the MLE can be computed by finding the frequency that maximizes the periodogram, this approach is often too computationally complex, even when the periodogram is computed using the fast Fourier transform (FFT).

A more efficient approach based on least-squares fitting of a line to the unwrapped phases of the signal samples was proposed by Tretter (S. A. Tretter, "Estimating the frequency of a noisy sinusoid by linear regression," IEEE Trans. Inform. Theory, vol. IT-31, pp. 832–835, November 1985). His technique was modified by Kay (S. Kay, "A fast and accurate single frequency estimator," IEEE Trans. Acoust., Speech, Signal Processing, vol. 37, pp. 1987–1990, December 1989; hereinafter "Kay's method") to remove the explicit use of phase unwrapping by performing least-squares processing of the phase differences between signal samples.

Like the MLE, these phase-based methods attain the CRB when the SNR is above a threshold; however, a problem with these phase-based methods is that the threshold is higher than for the MLE. In addition, the standard phase-based frequency estimate has a threshold that increases as the value of the frequency to be estimated moves toward the edges of the interval $(-\pi, \pi]$ radians/sample; this often limits the frequency range over which estimation can be accurately accomplished. Further, the threshold does not decrease as the number of samples, N, is increased.

Various methods have been proposed to improve the threshold performance of the phase-based methods, and make them behave more like the MLE. Djuric and Kay (P. M. Djuric and S. M. Kay, "Parameter estimation of chirp signals," IEEE Trans. Acoust., Speech, Signal Processing, vol. 38, pp. 2118–2126, December 1990; hereinafter "Djuric and Kay") used second-order differences of the phases, rather than the first-order differences used in Kay's method, to reduce the dependency of the threshold on frequency; the result is a nearly constant threshold across the entire frequency interval $(-\pi, \pi]$, with the threshold slightly above the level that occurs for midband frequencies for Kay's method. Actually, the intent of Djuric and Kay was to provide a method for estimating frequency rate as well as frequency; however, the technique they used can be exploited to provide a frequency estimate whose threshold is frequency independent. Alternatively, Kim et al. (D. Kim, M. J. Narasimha, and D. C. Cox, "An improved single frequency estimator," IEEE Signal Processing Letters, vol. 3, pp. 212–214, July 1996; hereinafter "Kim et al.") used a simple finite impulse response (FIR) filter to boost the SNR prior to computing and processing the phases. This reduces the threshold for frequencies near the center of the interval $(-\pi, \pi]$, but at the expense of further restrictions on the frequency estimation interval.

SUMMARY OF THE INVENTION

It is therefore an object of the present invention to provide a frequency estimation method whose performance is independent of frequency.

It is also an object of the invention to reduce the threshold level of SNR required for accurate frequency estimation.

Another object of the invention is to provide a method whose threshold decreases with an increasing number of samples.

It is a further object of the invention to allow phase-based estimation of multiple sinusoids.

It is also an object of the invention to accomplish the foregoing objects in a computationally efficient manner.

The method in accordance with the invention combines the frequency-independent threshold characteristic of Djuric and Kay with the lowered threshold characteristic of Kim et al.; the cost is modest additional computational complexity. The computational expense of this improvement is roughly 1.25 times as many multiplies and 1.5 times as many adds as are required by Kay's method, half as many arctangents as are required by Kay's method, and four compares (no compares are needed in Kay's method); also, the technique can be implemented in parallel to reduce the time required. The invention applies the filter used in Kim et al. to overlapping frequency bands that cover $(-\pi, \pi]$, detects which band the sinusoid is in, and then processes the phases of the detected band's output signal using Kay's method. The key to making this method work is to properly choose the frequency bands and to recognize that the filter outputs can be decimated before performing further processing.

This specification shows that the threshold performance and the frequency range of the phase-based frequency estimation can be extended simultaneously by applying filter bank processing prior to implementing the phase-based frequency estimation technique. In principle, the processing consists of creating three auxiliary signals by modulating the original signal and then applying the results of Kim et al. to the original signal as well as each of the three auxiliary signals. This can be viewed as applying the original signal to a highly overlapped four-channel filter bank, detecting which channel contains the sinusoid, and then applying phase-based frequency estimation to the selected channel. However, in practice, the key to making this approach computationally viable is four-fold: (i) the creation of the auxiliary signals requires a negligible amount of additional processing, (ii) the filter used to implement the filter bank consists of a two-tap FIR filter requiring no multiplies, (iii) the computational complexity can be reduced by developing a closed form for the frequency estimate given in Kim et al. and recognizing that this development indicates that decimation after the filter bank can be done without sacrificing the accuracy of the subsequent frequency estimate, and (iv) computations can be shared by using a detection statistic for the channel selection task that requires the computation of an intermediate result that can be reused during the frequency estimation step.

These reductions result in a method whose improved performance comes at the cost of a small increase in the computational complexity compared to Kay's method. In particular, using a 2×-decimated four-channel filter bank, it is possible to achieve a frequency-independent threshold that is about 3 dB lower than the threshold exhibited by Kay's method at frequencies near the middle of the frequency range. In addition, some of this additional computation can be done in parallel.

Recognizing that it is possible to repeatedly apply this method in a cascade fashion leads to a generalized approach using a filter bank having $4^p$ channels, where p is the number of cascade stages. The number of additions and multiplies roughly doubles for each additional stage and the number of compares quadruples for each additional stage; however, the number of arctangents is halved for each additional stage cascaded. Because the complexity of computing an arctangent can be much greater than that of additions and multiplies, the burden of implementing a few stages of cascade is unlikely to be prohibitive in most cases. Thus, for a modest increase in complexity beyond the phase-based method of Kay it is possible to achieve performance close to that of the ML estimator. In a sense, the cascade method presents a system designer with a flexible "discrete spectrum" of design choices ranging from the low-complexity, low performance original phase-based method to the high-complexity, high performance cascaded filter bank method (whose performance tends toward that of the ML method as the number of stages increases).

BRIEF DESCRIPTION OF THE DRAWINGS

The foregoing and other objects, aspects and advantages will be better understood from the following detailed description of a preferred embodiment of the invention with reference to the drawings, in which:

FIG. 4b is a more detailed block diagram of the frequency estimation block shown in FIG. 4a.

FIG. 5a shows a single estimated frequency and FIG. 5b shows multiple estimated frequencies.

FIG. 7A shows the results for Kay's method; FIG. 7B shows the results for the method of Djuric and Kay; FIG. 7C shows the results for the undecimated version of the four channel method; FIG. 7D shows the results for the decimated version of the four channel method.

FIG. 8A shows the results for Kay's method; FIGS. 8B, 8C and 8D, respectively, show the results using the decimated version of the cascaded filter bank (as shown in FIG. 5a) for the case of p=1,2, and 3, respectively, where p is the number of cascade stages used.

The following tables are embedded in the body of the specification:

Table I is a table showing computational complexity for the four channel method.

Table II is a table showing computational complexity for Kay's Method.

Table III is a table showing computational complexity for the method of Djuric and Kay.

Table IV is a table showing computational complexity for the method of the invention where detection and selection are done only after all stages of filtering.

Table V is a table showing computational complexity for the method of the invention where detection and selection are done after each stage of filtering.

DETAILED DESCRIPTION OF A PREFERRED EMBODIMENT OF THE INVENTION

Figure 1:
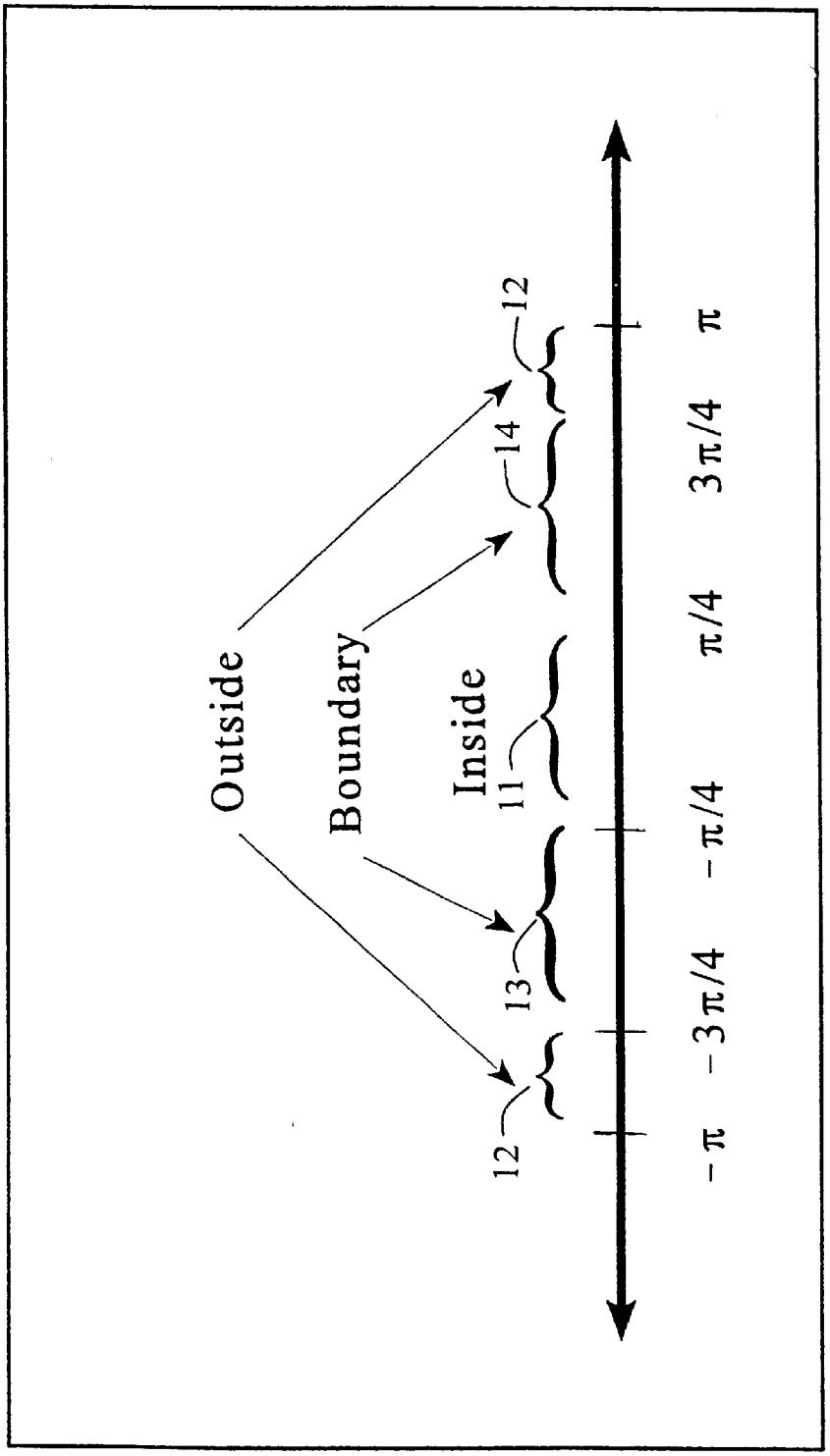
FIG. 1 is a chart showing the definition of "inside", "outside" and "boundary" frequency regions.
Figure 2A:
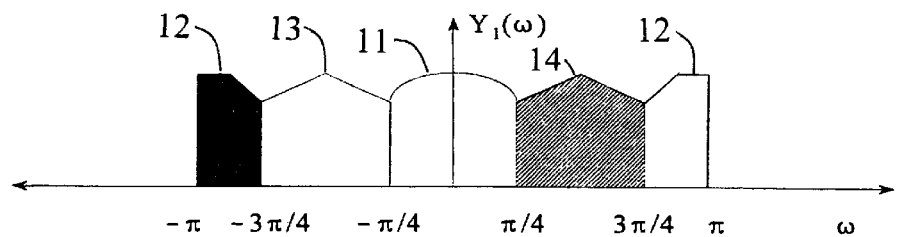
FIGS. 2A, 2B, 2C and 2D are representations, respectively, of the spectra of a signal and its three heterodyned versions.
Figure 2B:
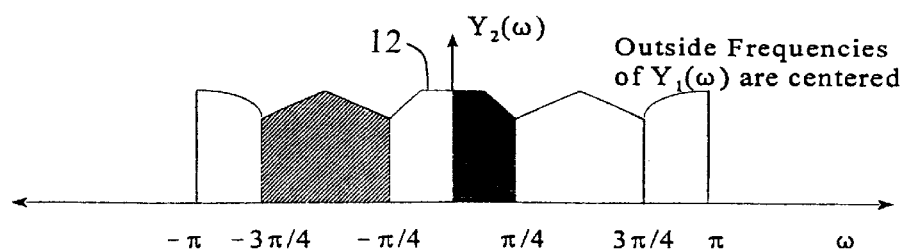
Figure 2C:
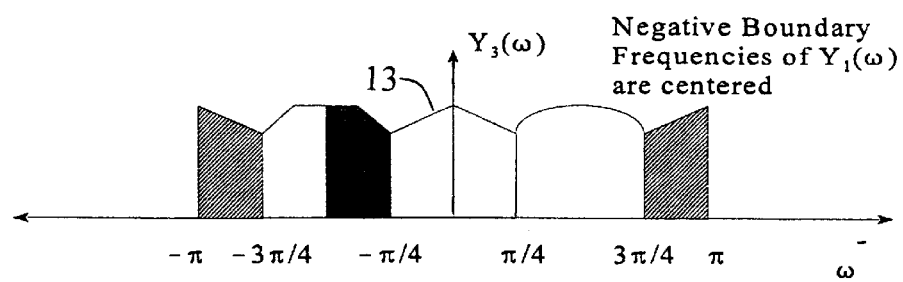
Figure 2D:
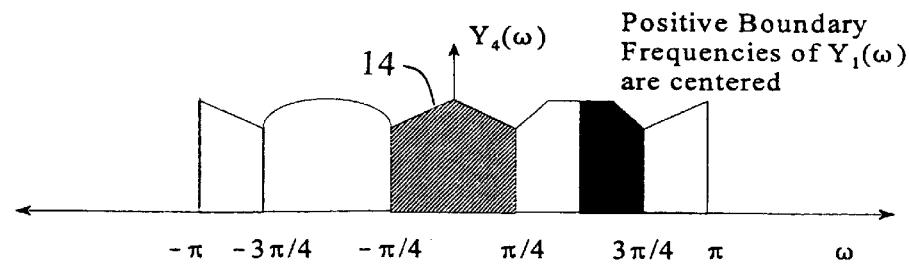

Referring now to the drawings, and more particularly to FIG. 1, there is shown a definition of frequency regions: a frequency within $(-\pi/4, \pi/4]$ radians/sample is called an inside frequency 11, a frequency within $(-\pi, -3\pi/4]\cup(3\pi/4, \pi]$ radians/sample is called an outside frequency 12, and a frequency within $(-3\pi/4, \pi/4]\cup(\pi/4, 3\pi/4]$ radians/sample is called a boundary frequency (negative boundary 13 and positive boundary 14). Kay's method works well for inside and boundary frequencies, while the method of Kim et al. works only for inside frequencies, but with a lower threshold than for Kay's method.

From the original signal $y_1(n)$ the succeeding signals $y_2(n)$, $y_3(n)$, and $y_4(n)$ are created by digitally heterodyning $y_1(n)$ with $e^{j\pi n}$, $e^{j\pi n/2n}$, and $e^{-j\pi n/2n}$, respectively. This is equivalent to multiplying $y_1(n)$ by the sequences $\{1, -1, 1, -1, \ldots\}$, $\{1, j, -1, -j, 1, j, -1, -j, \ldots\}$, and $\{1, -j, -1, j, 1, -j, -1, j, \ldots\}$, respectively. The computational cost of generating these new signals is negligible since it amounts to nothing more than sign changes and/or swaps of the real and imaginary parts of a sample.

Turning now to FIG. 2, there is shown the spectra of a signal and its three heterodyned versions, and in particular there is shown how the four frequency regions shown in FIG. 1 get rearranged to form $y_2(n)$, $y_3(n)$, and $y_4(n)$. FIG. 2A shows the signal, with the four frequency regions arrayed as in FIG. 1 (inside 11, outside 12, negative boundary 13 and positive boundary 14). These wrapped frequency regions are then shifted in FIGS. 2B, 2C and 2D so that outside frequencies 12, negative boundary frequencies 13, and positive boundary frequencies 14, respectively, of signal $y_1(n)$, are centered in $y_2(n)$, $y_3(n)$, and $y_4(n)$, respectively.

Figure 3:
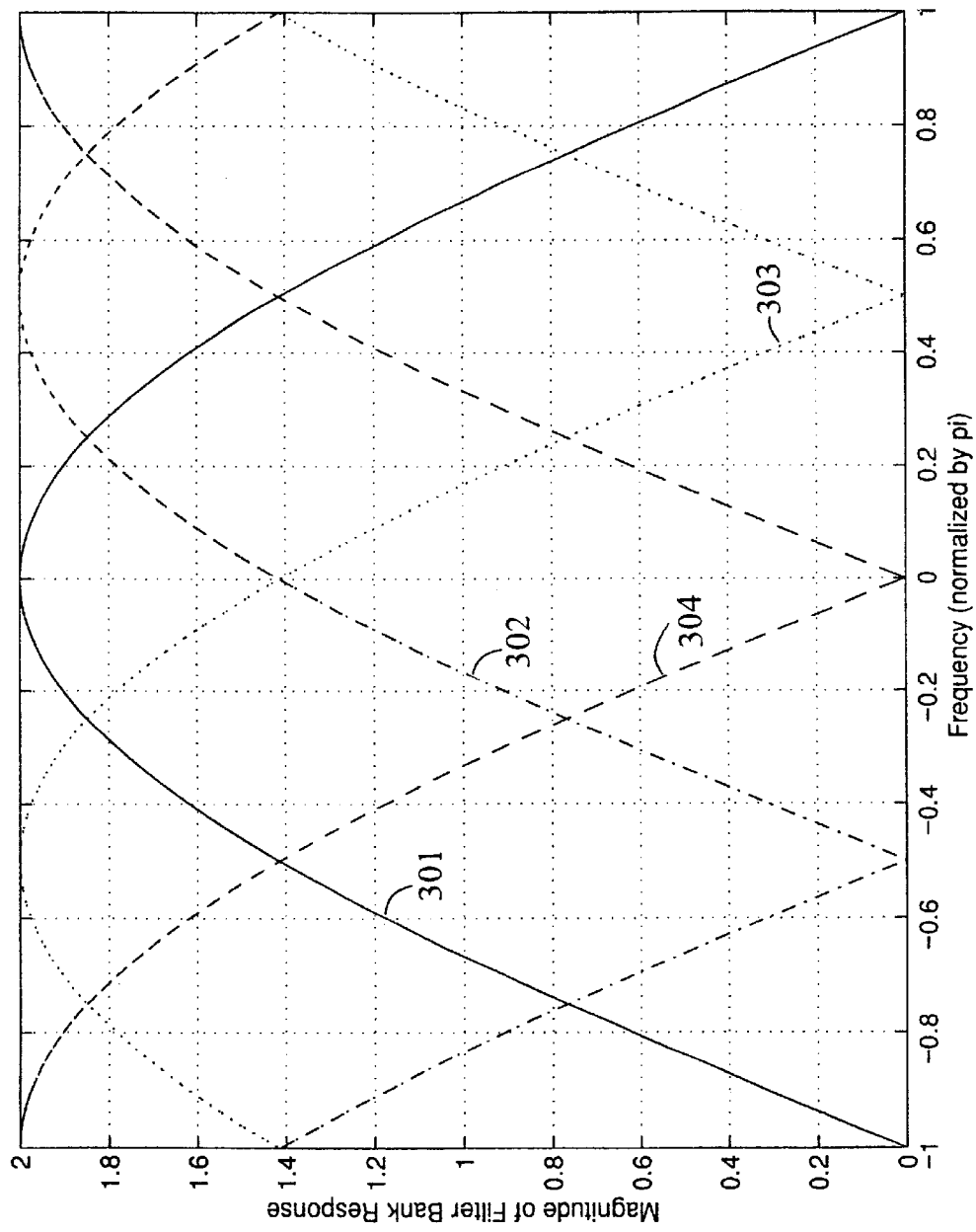
FIG. 3 is a representation of the transfer functions of the channels of the four channel filter bank.

Regardless of whether the original signal's frequency is an inside, outside, or boundary frequency, one of the four signals $y_1(n)$, $y_2(n)$, $y_3(n)$, and $y_4(n)$ will have the frequency as an inside frequency and the other three signals will have the frequency as either an outside frequency or a boundary frequency. The one that has an inside frequency satisfies the requirement for the method proposed in Kim et al., but the other three don't. Now apply each of the four signals to a lowpass FIR filter having only two taps (11), the same filter used in Kim et al.; each filter is simply implemented via one add per sample. The outputs are given by $$a_i(n) = y_i(n) + y_i(n+1), \; n = 1, 2, \ldots N-1 \quad (3)$$

for i=1, 2, 3, 4. The combination of the heterodyning and the filtering yields a four-channel filter bank, where the four filters, as shown in FIG. 3, are centered at 0 radians/sample 301, $\pi/2$ radians/sample 302, $-\pi/2$ radians/sample 303, and $\pm\pi$ radians/sample 304.

The filter outputs can be applied to a detector to determine which of the four filter outputs contain the most energy from the sinusoid. The form of the detector will be given later, but for now assume that the output of the $i^{th}$ detector is the detection statistic $\Gamma_i \geq 0$ and the signal giving rise to the largest $\Gamma_i$ is selected as the one containing the sinusoid; call that signal $a_m(n)$. This processing gives a coarse estimate of the frequency: if m=1 the frequency is an inside frequency, if m=2 it is an outside frequency, if m=3 it is a negative boundary frequency, and if m=4 it is a positive boundary frequency.

Now a fine estimate of the frequency is obtained by processing the phases of the selected filtered signal as described in Kim et al. Namely, the phase differences are computed using $$\Delta\phi_m(n) = \arg\{a_m(n+1)a_m^*(n)\}, \; n=1,2,3,\ldots,N-2. \quad (4)$$

Following Kim et al., define the $(N-2) \times 1$ vectors $$\Delta\phi_m = [\Delta\phi_m(N-2) \Delta\phi_m(N-3) \ldots \Delta\phi_m(1)]^T \; 1 = [1 \; 1 \ldots 1]^T, \quad (5)$$

and define the $(N-2) \times (N-2)$ matrix C to be proportional to the noise covariance of $\Delta\phi_m$ such that its elements are given by $$C_{jk} = \begin{cases} 2, & \text{if } k = j \\ -1, & \text{if } k = j \pm 2 \\ 0, & \text{otherwise.} \end{cases} \quad (6)$$

Then, using the frequency estimate given in Kim et al., the fine estimate of the frequency of the signal is given by $$\hat{\omega}_f = \frac{1^T C^{-1} \Delta\phi_m}{1^T C^{-1} 1}, \quad (7)$$

where the use of $C^{-1}$ accounts for the fact that the noise has been colored by the filter and the phase differencing. The use of $C^{-1}$ in (7) ensures that the CRB is attained when the SNR is above threshold. The form given in (7) is computationally expensive due to the inversion of C (unless the value of N is fixed and known a priori); however, a computationally efficient closed-form version of the estimate shown in (7) is given hereafter. Finally, the frequency estimate is found by combining this fine estimate with the coarse estimate as follows:

$$\hat{\omega}_0 = \begin{cases} \hat{\omega}_f, & \text{if } m = 1 \\ (\hat{\omega}_f - \pi)_{mod 2\pi}, & \text{if } m = 2 \\ \hat{\omega}_f - \frac{\pi}{2}, & \text{if } m = 3 \\ \hat{\omega}_f + \frac{\pi}{2}, & \text{if } m = 4, \end{cases} \quad (8)$$

where the mod $2\pi$ indicates that if the argument is less than $-\pi$, then $2\pi$ is added to the argument; when m=2 this can be implemented by adding $\pi$ to $\hat{\omega}_f$ when it is less than or equal to zero and subtracting $\pi$ otherwise.

The form of the estimate given in (7) requires inversion of the matrix C given in (6). It is possible to develop a closed form version of the estimate given in (7); only even values of N will be considered here because it leads to an efficient structure for the processing (development for odd values of N is possible, but it leads to a less-efficient algorithm).

The inverse of C can be found as follows. Define $\tilde{N} = N-2$, the $\tilde{N} \times 1$ vector $1_{\tilde{N}} = [1 \; 1 \ldots 1]$, and an $\tilde{N} \times \tilde{N}$ unitary matrix P such that;

$$Px = [x_1 \; x_3 \; x_5 \ldots x_{\tilde{N}-1} \; x_2 \; x_2 \; x_4 \; x_6 \ldots x_{\tilde{N}}]^T \quad (9)$$

that is $$P_{jk} = \quad (10)$$

$$\begin{cases} 1, & \text{for } j = 1, 2, \ldots, \tilde{N}/2 \text{ and } k = 2j - 1 \\ 1, & \text{for } j = \tilde{N}/2 + 1, \tilde{N}/2 + 2, \ldots, \tilde{N} \text{ and } k = 2j - \tilde{N} \\ 0, & \text{otherwise.} \end{cases}$$

Then $$C^{-1} = P^T (PCP^T)^{-1} P \underline{\Delta} P^T \hat{C}^{-1} P \quad (11)$$

and $\hat{C}$ is block diagonal with $\hat{C} = \text{diag}\{B, B\}$, where B is the $\tilde{N}/2 \times \tilde{N}/2$ matrix with elements given by $$B_{jk} = \begin{cases} 2, & \text{if } k = j \\ -1, & \text{if } k = j \pm 1 \\ 0, & \text{otherwise.} \end{cases} \quad (12)$$

which is proportional to the covariance arising in Kay. Then $\hat{C}^{-1} = \text{diag}\{B^{-1}, B^{-1}\}$ and Equation (7) becomes $$\hat{\omega}_f = \frac{1_N^T \hat{C}^{-1}(P\Delta\phi_m)}{1_N^T \hat{C}^{-1} 1_N} = $$

$$\frac{1_{N/2}^T B^{-1}[\Delta\phi_m^e + \Delta\phi_m^o]}{2[1_{N/2}^T B^{-1} 1_{N/2}]} = \sum_{n=1}^{\frac{N-2}{2}} w_n [\Delta\phi_m(2n-1) + \Delta\phi_m(2n)], \quad (13)$$

where, using a result in Kay, the weights are $$w_n = \frac{3n\left(\frac{N}{2} - n\right)}{\frac{N}{2}\left(\left(\frac{N}{2}\right)^2 - 1\right)}, \quad n = 1, 2, 3, \ldots, \frac{N-2}{2}. \quad (14)$$

This gives a more efficient way to compute the frequency estimate than using (7).

In some cases it may be desirable to compute the weights using two coupled first-order difference equations. Defining $$a = \frac{-6}{\frac{N}{2}\left(\left(\frac{N}{2}\right)^2 - 1\right)}, \quad b = \frac{3 + 3N/2}{\frac{N}{2}\left(\left(\frac{N}{2}\right)^2 - 1\right)}, \quad (15)$$

and initializing $y(0)=z(0)=0$ gives $w_n=z(n)$ for $n=1, 2, 3, \ldots, (N-2)/2$. Using this scheme the weights can be computed using one table lookup (i.e., $$y(n)=y(n-1)+a, n=1, 2, 3, \ldots (N-2)/2, z(n)=z(n-1)+y(n)+b, n=1, 2, 3, \ldots (N-2)/2, \quad (16)$$

use the value of N to index a table holding the values of a and b as functions of N) and N−2 real additions.

Further reduction in computation can be obtained by recognizing that in (13) we have $$\Delta\phi_m(2n-1) + \quad (17)$$

$$\Delta\phi_m(2n) = [\phi_m(2n) - \phi_m(2n-1)] + [\phi_m(2n+1) - \phi_m(2n)] =$$

$$\arg\{a_m(2n+1)a_m^*(2n-1)\} \stackrel{\Delta}{=} \Delta_o\phi_m(n), \quad n = 1, 2, 3, \ldots, \frac{N-2}{2},$$

or in words, that the estimate can be computed using only the phase differences between the odd samples of the filter output in (3), i.e., the filter's output can be decimated by two prior to forming the phase differences. This result allows (13) to be written as $$\omega_f = \sum_{n=1}^{\frac{N-2}{2}} w_n \Delta_o \phi_m(n). \quad (18)$$

This shows that the filters following the digital heterodyning can decimate their outputs by a factor of two. Thus, the nondecimated filters of (3) are replaced by the decimated filters given by $$\tilde{a}_i(n) = y_i(2n-1) + y_i(2n), \text{ for } n = 1, 2, \ldots, \frac{N}{2}, \quad (19)$$

for i=1, 2, 3, 4. Because the filters are length-two FIR filters, their decimated-by-two outputs are now white. This whiteness allows the detection statistic described above to be chosen as $$\Gamma_i = \left|\sum_{n=1}^{\frac{N}{2}-1} \tilde{a}_i(n+1)\tilde{a}_i^*(n)\right|^2, i = 1, 2, 3, 4, \quad (20)$$

which was shown in Lank et al. (G. W. Lank, I. S. Reed, and G. E. Pollon, "A semicoherent detection and doppler estimation statistic," IEEE Trans. Aerosp. and Electron. Syst., vol. AES-9, pp. 151–165, March 1973; hereinafter "Lank et al.") to be better than the sum of squared magnitudes when operated in white noise; in addition this choice allows the sharing of computations between computing the detection statistic and computing phase differences (see comments below concerning saving lag product computations from the detection statistic for later use in computing phase differences).

There is a subtle distinction between (18) and (13): the development of (18) assumed that no phase unwrapping errors occurred, but the decimation inherent in (18) increases the likelihood of a phase unwrapping error, thus (18) has a slightly more restricted frequency estimation range than does (13). However, because of the severe frequency-overlap of the filters in the filter bank, the impact is negligible in the application here, as is shown in the simulations presented hereafter.

Figure 4A:
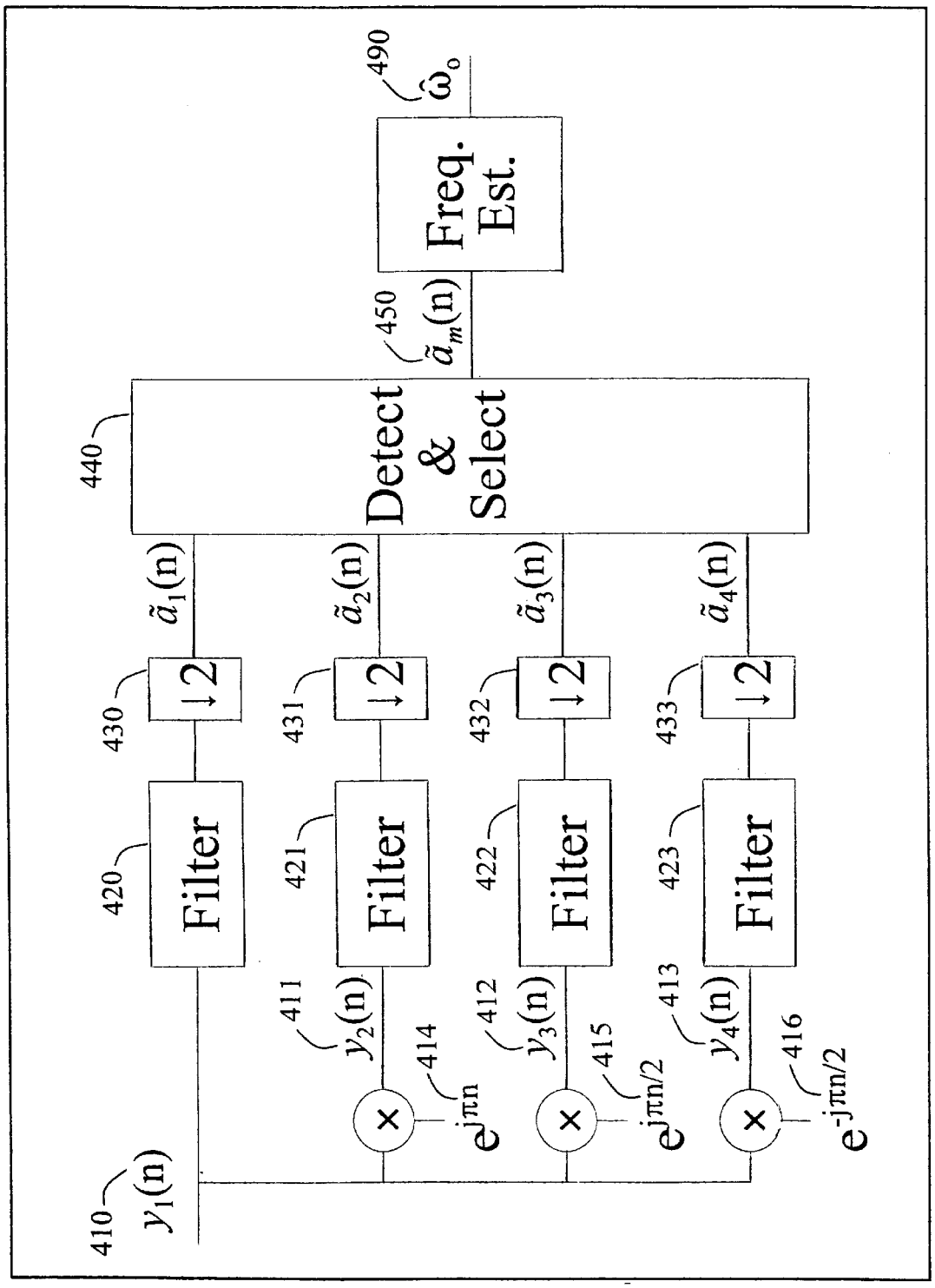
FIG. 4a is a block diagram showing heterodyning, filtering, decimation, detection & selection, and frequency estimation in accordance with the invention.
Figure 4B:
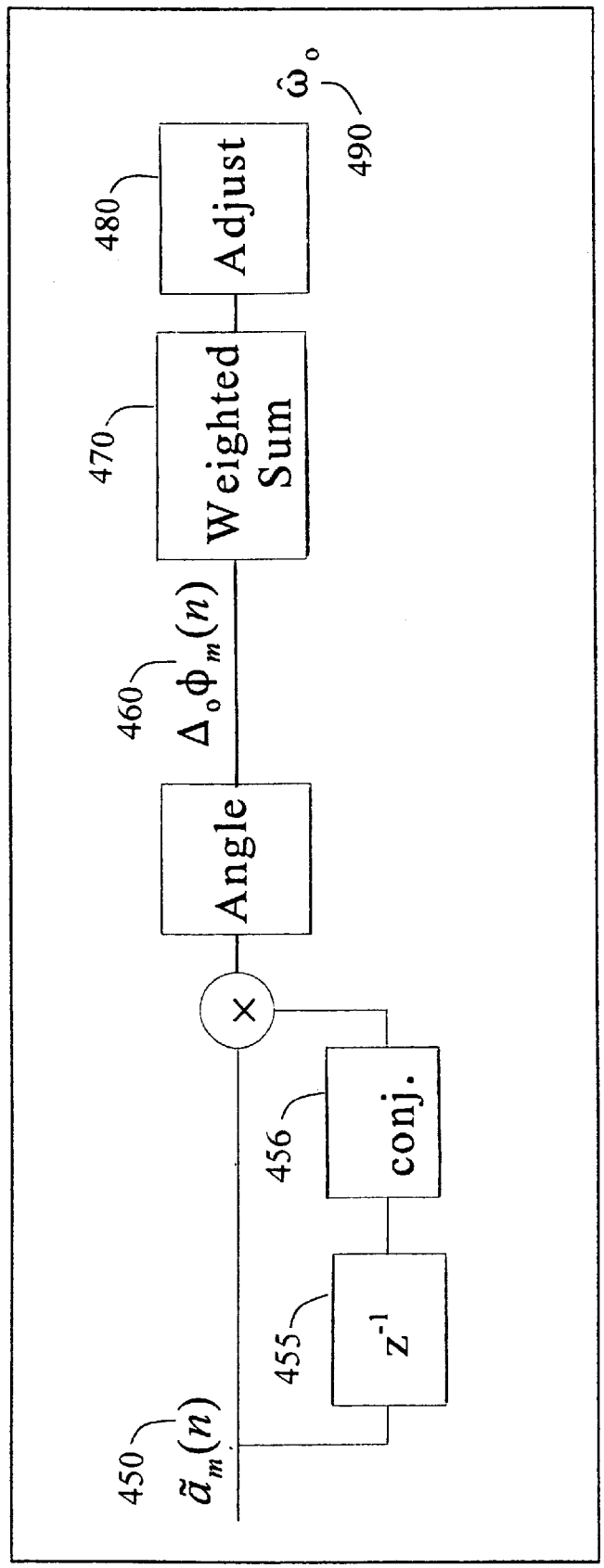

The above results lead to the algorithm shown in FIG. 4a consisting of the following steps: given $y_1(n)$ 410 as in (1), 1. Generate $y_2(n)$ 411, $y_3(n)$ 412, and $y_4(n)$ 413 by "multiplying" $y_1(n)$ 410 by the sequences $\{1, -1, 1, -1, \ldots\}$ 414, $\{1, j, -1, -j, 1, j, -1, -j, \ldots\}$ 415, and $\{1, -j, -1, -j, 1, -j, -1, j, \ldots\}$ 416, respectively; the "multiplication" can be accomplished through sign changes and/or swapping the real and imaginary parts of certain samples.
2. Filter (420, 421, 422, and 423, respectively) and decimate (430, 431, 432, and 433, respectively) each of these signals according to (19).
3. Select the signal $\tilde{a}_m(n)$ 450 using the detection statistic given in (20); $\tilde{a}_m(n)$ is the signal whose detection statistic $\Gamma_m$ satisfies $\Gamma_m = \max\{\Gamma_1, \Gamma_2, \Gamma_3, \Gamma_4\}$.
4. Compute the phase differences $\Delta_o\phi_m(n)$ 460 of $\tilde{a}_m(n)$ 450 as shown in FIG. 4b using $$\Delta_o\phi_m(n) = \arg\{a_m(n+1)a_m^*(n)\}, \text{ for } n = 1, 2, 3, \ldots, \frac{N}{2} - 1. \quad (21)$$

The signal $\tilde{a}_m^*(n)$ is computed by successively applying a delay 455 and conjugation 456 to $\tilde{a}_m(n)$.
5. Compute the fine frequency estimate as a weighted sum 470 using (18) and (14); the weights in (14) can be computed using (15) and (16).
6. Adjust 480 weighted sum 470 to produce $\hat{\omega}_o$ 490 according to (8).

The computational complexity of the method will now be assessed and summarized in Table I:

TABLE I

|  | Adds | Mults. | Arctans | Compares | Lookups |
|---|---|---|---|---|---|
| Heterodyne | — | — | — | — | — |
| Filters | 2N | — | — | — | — |
| Detect/Select | 2N – 8 | 2N | — | 3 | — |
| Phase Deltas | — | — | N/2 – 1 | — | — |
| Weights | 3N/2 – 3 | — | — | — | 1 |
| Freq. Est. | N/2 – 2 | N/2 – 1 | — | — | — |
| Adjust | 1 | — | — | 1 | — |
| Total for Invention | 6N – 12 | 2.5N – 1 | N/2 – 1 | 4 | 1 |

Note that all tallied additions and multiplies are complex. As discussed, the complex exponentials used in the heterodyning process have a special structure that requires very little effort to implement the heterodyning; therefore it will be assumed that their contribution to the computational complexity is negligible. Because of the decimation, each of the four filters need only compute N/2 output points, with each output point computed with a single addition; thus, the four filters and decimators require a total of 2N additions. A detection statistic for each of the four filter outputs must be computed using (20). Computing the sum in (20) for each of the four statistics requires N/2–2 additions and N/2–1 multiplies, while computing the magnitude squared requires 1 multiply. Finding the largest of the four detection statistics requires three compares. Computing the phase differences in (21) requires N/2–1 arctangents to compute the angles of the lag products; note that the lag products don't need to be computed here because they were already computed when computing the detection statistics in (20) and can be saved for use in computing the phase differences. Computing the weights given in (14) requires one table lookup indexed by N to find the values a and b as specified in (15) and requires 1.5N–3 additions to iterate the system in (16). Computing the fine frequency estimate using (18) requires N/2–1 multiplies and N/2–2 additions. Finally, adjusting the fine estimate using the coarse estimate requires one addition and, in the worst case, one compare. The totals for the invention are listed in Table I.

As a comparison, the computational complexity of Kay's method is presented in Table II:

TABLE II

|  | Adds | Multiplies | Arctans | Lookups |
|---|---|---|---|---|
| Phase Deltas | — | N – 1 | N – 1 | — |
| Weights | 3N – 3 | — | — | 1 |
| Freq. Est. | N – 2 | N – 1 | — | — |
| Total for Kay's Method | 4N – 5 | 2N – 2 | N – 1 | 1 |

Kay's method consists of forming the N–1 phase differences of (1), given by $$\Delta\phi(n) = \arg\{y_1(n+1)y_1^*(n)\}, n=1,2,3,\ldots,N-1, \quad (22)$$

and then computing the frequency estimate using $$\hat{\omega}_o = \sum_{n=1}^{N-1} \tilde{w}_n \Delta\phi(n), \quad (23)$$

where the weights are given by $$\tilde{w}_n = \frac{6n(N-n)}{N(N^2-1)}, n=1, 2, 3, \ldots, N-1 \quad (24)$$

and can be computed using (16) for n=1, 2, 3, N–1 with the values for a and b set to $$a = \frac{-12}{N(N^2-1)}, \quad b = \frac{6+6N}{N(N^2-1)}. \quad (25)$$

The computations required by Kay's method are shown in Table II.

Comparing the totals shown in Tables I and II we see that the invention requires 1.25 times as many multiplies and 1.5 times as many adds, but only half as many arctangents as does Kay's method; in addition, it requires 4 compares that Kay's method doesn't need.

Also for comparison, the computational complexity of the method of Djuric and Kay is presented in Table III:

TABLE III

|  | Adds | Multiplies | Arctans | Lookups |
|---|---|---|---|---|
| z's in (26) | — | N – 1 | — | — |
| Double Δ's in (26) | — | N – 2 | N – 2 | — |
| Phase Δ's in (27) | N – 2 | — | 1 | — |
| Weights | 3N – 3 | — | — | 1 |
| Freq. Est. | N – 2 | N – 1 | — | — |
| Total for Djuric & Kay Method | 5N – 7 | 3N – 4 | N – 1 | 1 |

Their method consists of forming the double-differenced phase using $$z(n)=y_1(n+1)y_1^*(n), n=1, 2, 3, ,\ldots, N-1, \Delta^2\phi(n)=\arg\{z(n+1)z^*(n)\}, n=1, 2, 3, ,\ldots, N-2 \quad (26)$$

and then computing the single-differenced phases by passing the double-differenced phases through a simple IIR filter:

$$\Delta\phi(n)=\Delta^2\phi(n-1)+\Delta\phi(n-1), n=2, 3, \ldots, N-1, \quad (27)$$

with $\Delta\phi(1)=\arg\{_y^*(1)y(2)\}$. Once these single-differenced phases are computed the estimate is found using (23) and (24). The computational complexity of this method is summarized in Table III.

Comparing the totals shown in Tables I and III we see that the invention requires 1.2 times as many adds, 0.8 times as many multiplies, but only half as many arctangents as does the method of Djuric and Kay; in addition, it requires 4 compares that the method of Djuric and Kay doesn't need.

The technique described herein uses a four-channel filter bank and can be extended by increasing the number of channels and decreasing the channel bandwidth. The decreased channel bandwidth results in a higher SNR in the channel containing the signal, which yields a threshold that is even lower than that achieved using the four-channel technique. We will now describe how to iteratively apply the results for the four-channel technique to increase the number of filter bank channels.

Results given in Umesh and Nelson (S. Umesh and D. Nelson, "Computationally Efficient Estimation of Sinusoidal Frequency at Low SNR," Proc. IEEE Internat. Conf. Acoust., Speech, and Signal Proc., pp. 2797–2800, 1996; hereinafter "Umesh and Nelson") describe the use of an FFT-based filter bank having $L=2^r$ channels to improve the threshold of phase-based frequency estimation, but these channels are not as highly overlapped as those proposed here, which causes some problems. It is shown in Umesh and Nelson that as L is increased the threshold is decreased, but at the expense of not quite attaining the CRB when the SNR is above threshold. Worse still, because of the lower degree of overlap of the filter bank channels, when the frequency lies on a boundary between channels, the threshold improvement is less dramatic and the loss with respect to the CRB is larger than when the frequency lies at the center of a channel. The latter of these two degradations can be removed by averaging over two adjacent channels before computing the frequency estimate shown in Umesh and Nelson, but the reduced threshold is not eliminated by this averaging (see FIG. 2 in Umesh and Nelson). These problems are mitigated in the approach described below.

Figure 5A:
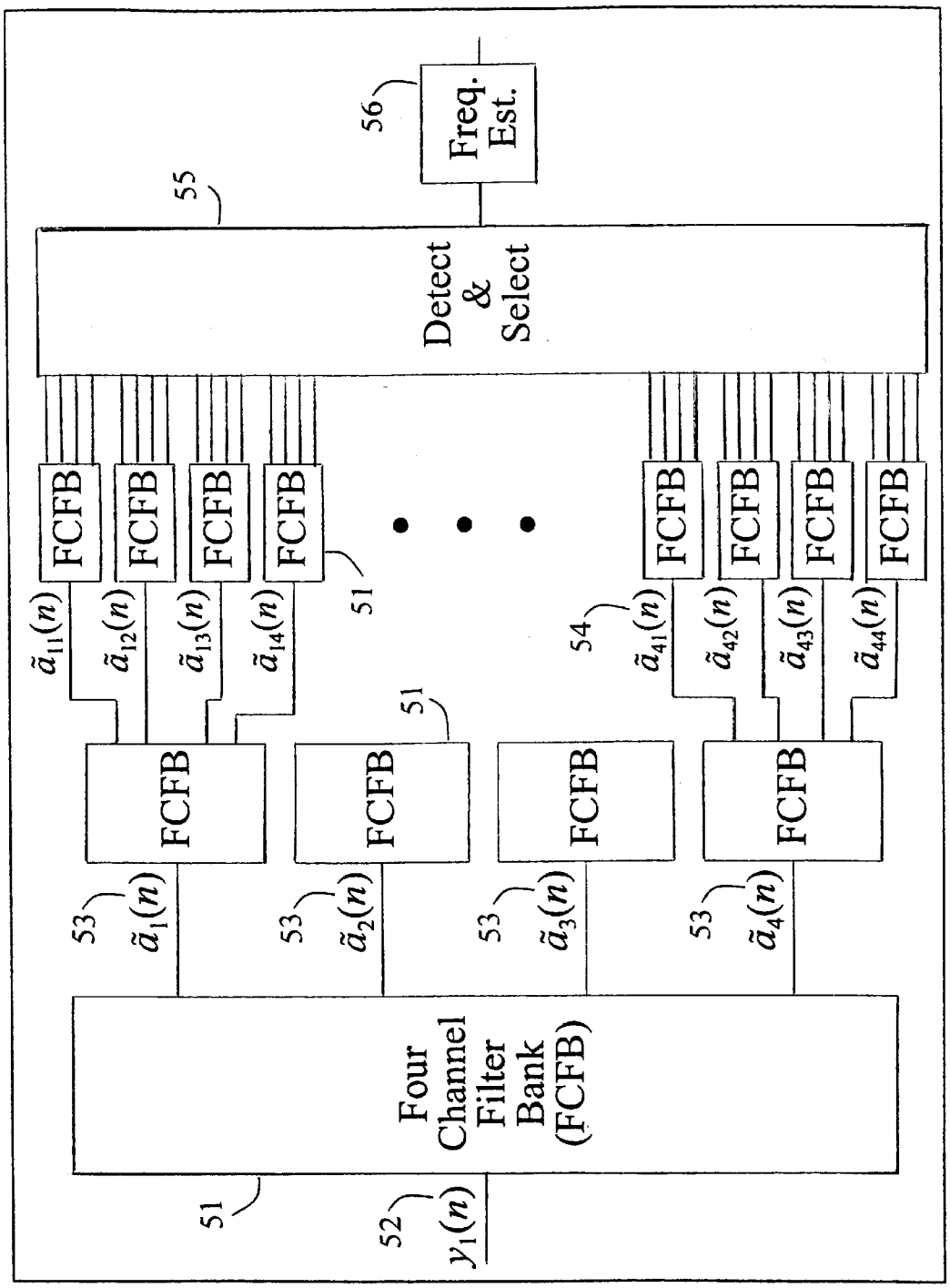
FIGS. 5a and 5b are block diagrams showing a cascaded filter bank method with three stages of cascade followed by detection & selection and frequency estimation, where

Notice that in the four-channel filter bank described above, the impact of the decimation is two-fold: (i) the noise is white, because the filter length is equal to the decimation rate, and (ii) the digital frequency range after filtering and decimating can be again considered to be $(-\pi,\pi]$. These are the two conditions on the original signal in (1) that allowed the application of the four-channel filter bank; therefore, we can apply another four-channel filter bank to each of the four decimated filter outputs in (19). This procedure can be iterated as many times as the length of the original signal will allow. FIG. 5a shows a three-level cascade structure that implements this idea; each block in this figure that is labeled as a four-channel filter bank (FCFB) 51 performs the heterodyne-filter-decimate portion of FIG. 4. At the end of p stages of cascade there are $4^p$ channels in the filter bank. In Detect & Select block 55, a detection statistic is computed using (20) for each of the $4^p$ outputs, and the channel output having the largest detection statistic is selected, and then in block 56 is subjected to phase-based frequency estimation to obtain a fine frequency estimate. The coarse frequency estimate is determined from the index $m \in \{1, 2, 3, \ldots, 4^p\}$ of the channel selected by the detection process as follows. The selected channel is the result of successive filtering: the first stage divides the full frequency range 52 into four channels 53, the second stage divides each of these into four channels 54 to give 16 channels, and so on. The first stage resolves the coarse frequency estimate to one of $\{-\pi/2, 0, \pi/2, \pi\}$, the second stage further resolves each of these to an additional amount chosen from $\{-\pi/4, 0, \pi/4, \pi/2\}$, etc. After p stages this process can be expressed as $$\hat{\omega}_c = (r_1 - 1)\frac{\pi}{2} + (r_2 - 1)\frac{\pi}{4} + (r_3 - 1)\frac{\pi}{8} + \ldots + (r_p - 1)\frac{\pi}{2^p}, \quad (28)$$

where $r_i$ is the $i^{th}$ digit in the base 4 representation of m-1, where leading zeros are appended if needed to give p digits, and $r_1$ is the most significant digit. The total frequency estimate is given by $$\hat{\omega}_o = \begin{cases} \hat{\omega}_c + \hat{\omega}_f, & \text{if } \hat{\omega}_c + \hat{\omega}_f \leq \pi \\ \hat{\omega}_c + \hat{\omega}_f - 2\pi, & \text{otherwise.} \end{cases} \quad (29)$$

We now consider the computational complexity of this scheme. At the first stage of the cascade the implemented filters are the same as in the four-channel technique, at the next stage we have four times as many filters as the previous stage but they operate on half as many points as in the previous stage, and so on. Thus, the number of adds needed to implement the filters in a p stage filter bank is:

$$\text{Adds} = 2N + 4 \cdot 2N/2 + 4^2 \cdot 2N/2^2 + \ldots + 4^{p-1} \cdot 2N/2^{p-1} \quad (30)$$

$$= 2N \sum_{m=0}^{p-1} 2^m = 2N(2^p - 1)$$

Each of the $4^p$ output signals consists of $N/2^p$ samples, so the detection statistics require $4^p(N/2^p-1)$ multiplies to form the lags, another $4^p$ multiplies to form the magnitude squares, and $4^p(N/2^p-2)$ adds to form the sums; to complete the detect/select task requires $4^p-1$ compares. The remainder of the computational tasks are similar to those tabulated in Table I, except that N/2 should be replaced by $N/2^p$. These computational complexities are summarized in Table IV, where we see that the number of adds and multiplies increase linearly in N and exponentially in p, while the number of compares increase exponentially with p; however, the number of arctangents decreases exponentially with p.

TABLE IV

| | Adds | Mults. | Arctans | Compares | Lookups |
|---|---|---|---|---|---|
| Hetero-dyne | — | — | — | — | — |
| Filters | $2N (2^p - 1)$ | — | — | — | — |
| Detect/Select | $2^p N - 2 \cdot 4^p$ | $2^p N$ | — | $4^p - 1$ | — |
| Phase Deltas | — | — | $N/2^p - 1$ | — | — |
| Weights | $3N/2^p - 3$ | — | — | — | 1 |
| Freq. Est. | $N/2^p - 2$ | $N/2^p - 1$ | — | — | — |
| Adjust | 1 | — | — | 1 | — |

Figure 5B:
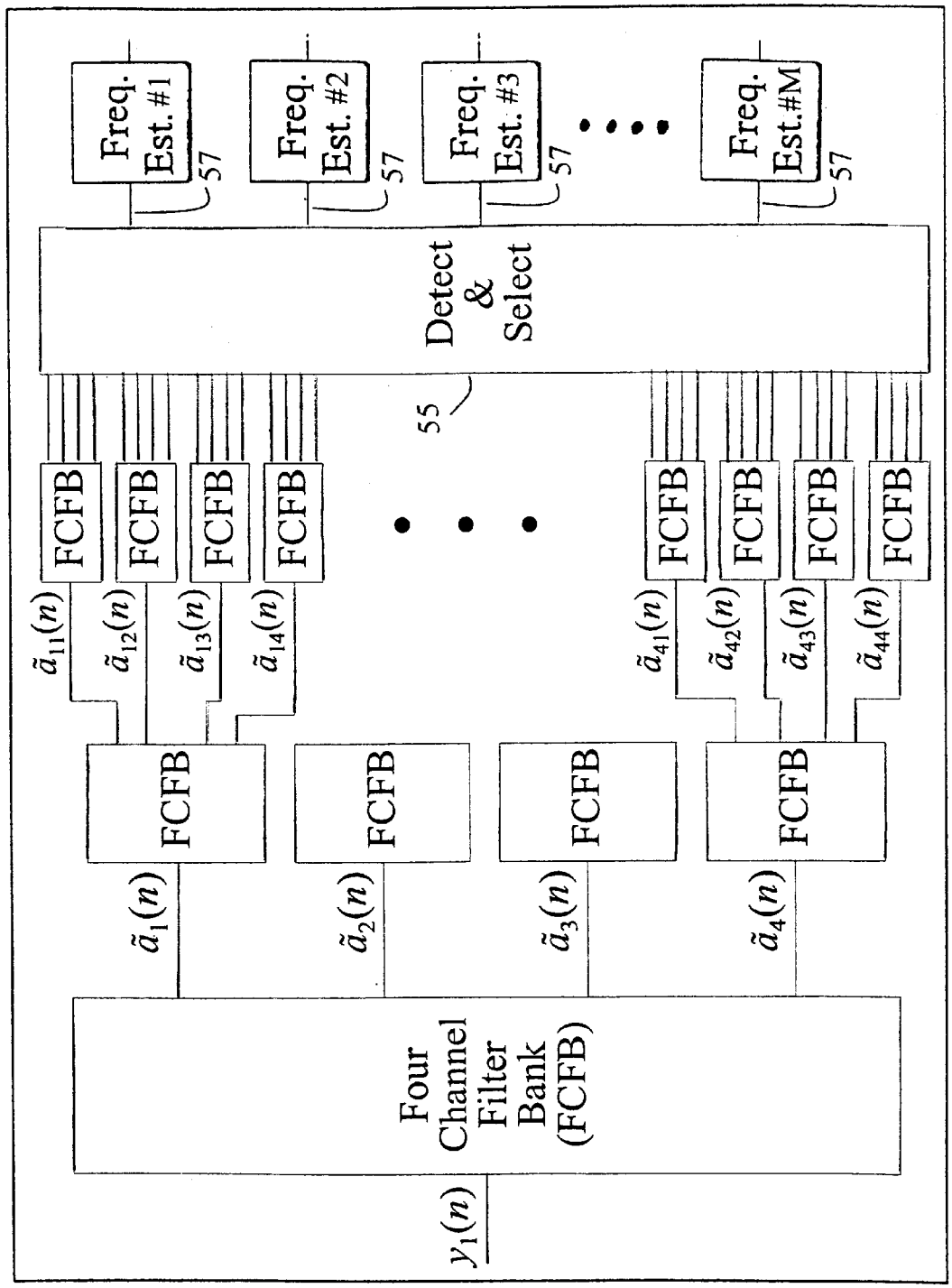

An alternative, shown in FIG. 5b, is to use the Detect & Select function 55 to select M>1 channels 57 for subsequent phase-based frequency estimation to allow the frequency estimation for the case of simultaneously received multiple sinusoids. This can be done either of two ways. In the first way, the value of M can be specified a priori, in which case the Detect & Select function 55 selects the channels having the M largest detection statistics computed by (20). In the second way, a threshold can be specified or computed in accordance with signal detection theory that is known to those suitably skilled in the art, in which case the Detect & Select function 55 selects those channels having detection statistics computed by (20) that exceed the threshold.

Figure 6:
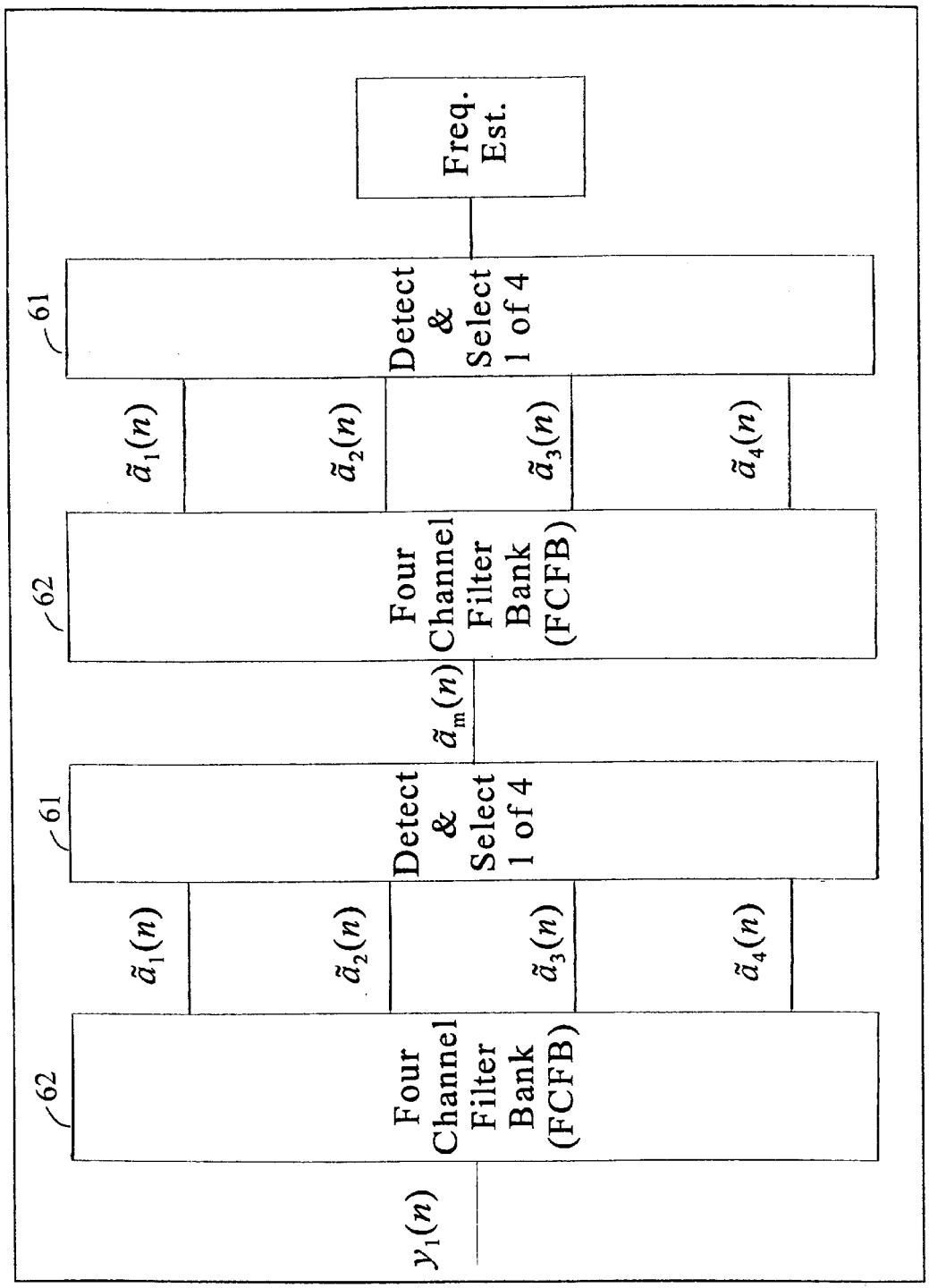
FIG. 6 is a cascaded filter bank method showing two cascade stages with detection and selection occurring after each stage.
Figure 7A:
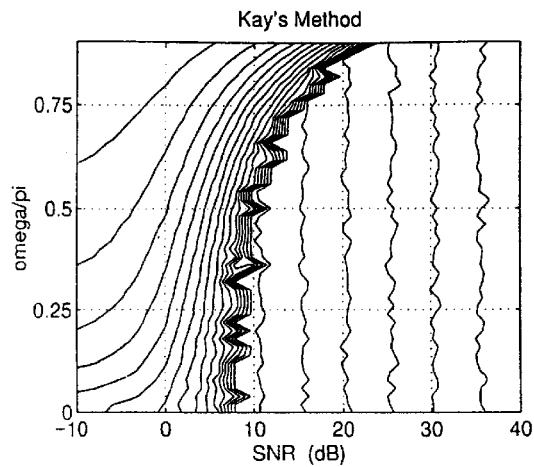
FIGS. 7A, 7B, 7C and 7D are a series of graphs showing simulation results of the four-channel method compared to the simulation results obtained using Kay's method and the method of Djuric and Kay. In, each plot the contours represent the loci of constant inverse MSE in decibels as a function of frequency and SNR; in each plot the right most contour represents 100 dB and each subsequent contour to the left decreases the inverse MSE by 5 dB. The number of signal samples processed was N=256.
Figure 7B:
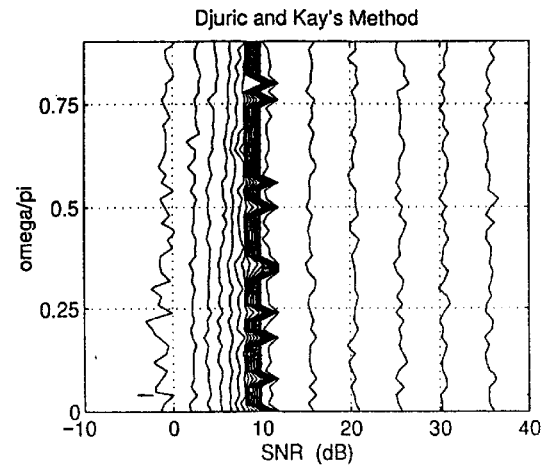
Figure 7C:
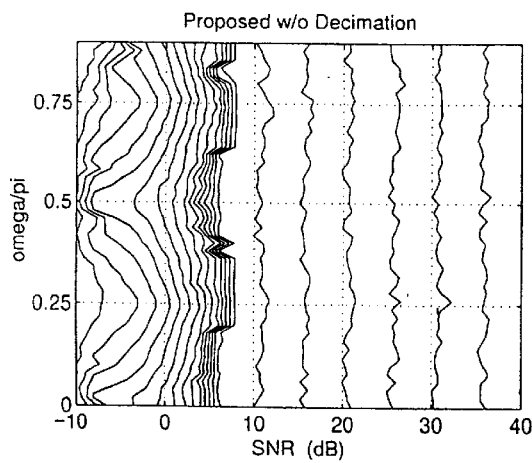
Figure 7D:
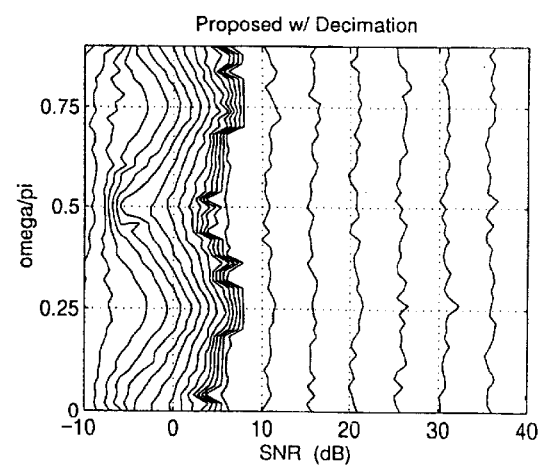
Figure 8A:
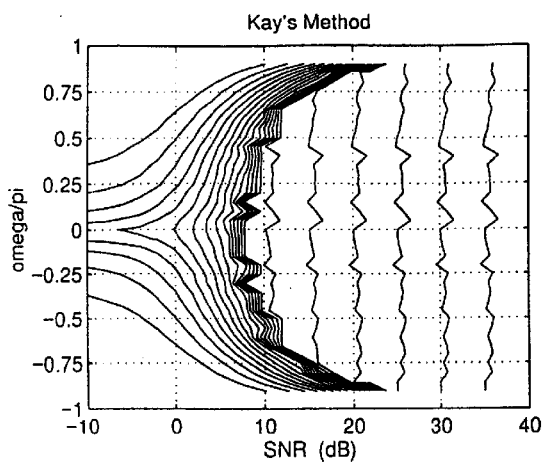
FIGS. 8A, 8B, 8C and 8D are a series of graphs showing simulation results of the cascaded filter bank method compared to the simulation results obtained using Kay's method. In each plot the contours represent the loci of constant inverse MSE in decibels as a function of frequency and SNR; in each plot the right most contour represents 100 dB and each subsequent contour to the left decreases the inverse MSE by 5 dB. The number of signal samples processed was N=256.
Figure 8B:
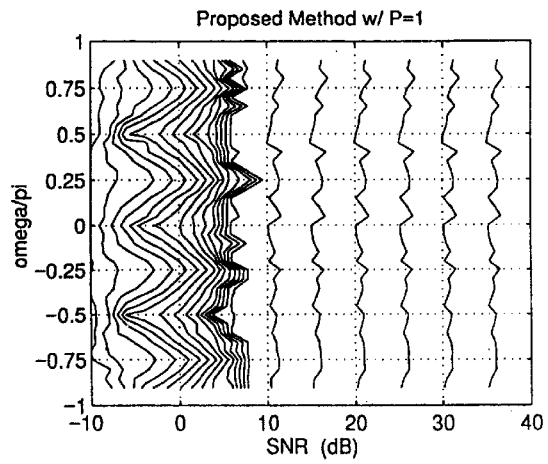
Figure 8C:
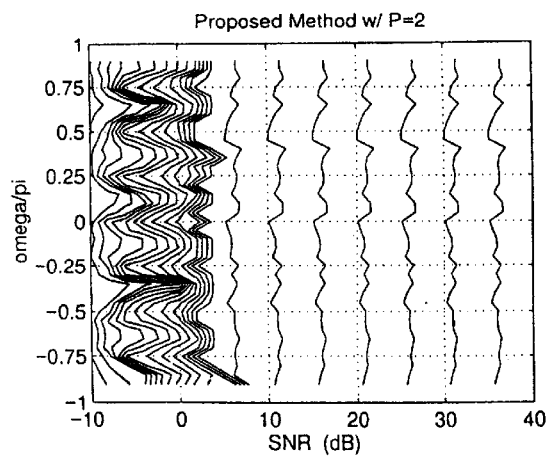
Figure 8D:
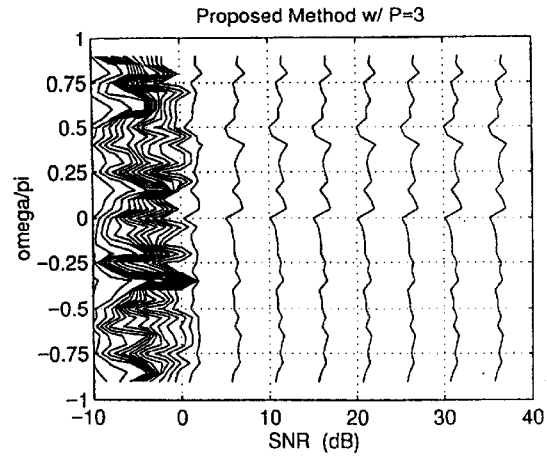

Another alternative, shown in FIG. 6 for a two stage cascade, is to perform a 1-of-4 detection/selection 61 between every cascade stage 62. This reduces the number of computations at the expense of requiring higher SNR to accomplish the correct sequence of detections. Each four-channel filter bank section 62 operates on half as many points as the previous one, so the number of adds for the filters is given by $$\text{Adds} = 2N + 2 \cdot N/2 + 2 \cdot N/2^2 + \ldots + 2 \cdot N/2^{p-1} \quad (31)$$

$$= 2N \sum_{m=0}^{p-1} 2^{-m}$$

$$= 2N(2 - 2^{-(p-1)})$$

$$\approx 4N$$

The detection done in the $k^{th}$ cascaded stage requires $4(N/2^k-1)$ multiplies, $4(N/2^k-2)$ additions, and 3 compares, so p stages require $$\text{mults} = 2N \sum_{m=0}^{p-1} 2^{-m} - 4p \qquad (32)$$

$$= 2N(2 - 2^{-(p-1)}) - 4p$$

$$\approx 4N - 4p,$$

$$\text{adds} = 2N \sum_{m=0}^{p-1} 2^{-m} - 8p \qquad (33)$$

$$= 2N(2 - 2^{-(p-1)}) - 8p$$

$$\approx 4N - 8p,$$

and 3p compares. The remainder of the computational tasks are identical to those shown in Table IV. The computational complexity results for this alternative method are tabulated in Table V.

TABLE V

| | Adds | Mults. | Arctans | Compares | Lookups |
|---|---|---|---|---|---|
| Heterodyne | — | — | — | — | — |
| Filters | 4N | — | — | — | — |
| Detect/Select | 4N − 4p | 4N − 8p | — | 3p | — |
| Phase Deltas | — | — | N/2$^p$ − 1 | — | — |
| Weights | 3N/2$^p$ − 3 | — | — | — | 1 |
| Freq. Est. | N/2$^p$ − 2 | N/2$^p$ − 1 | — | — | — |
| Adjust | 1 | — | — | 1 | — |

All of the alternatives discussed above rely on the fact that decimating by a factor of two after filtering by the length two filter defined by (3) results in white noise. An alternative is to use a filter that has a length greater than two but still delivers white noise after decimating by a factor of two. The additional flexibility available from this longer filter allows designing filter banks that still adequately cover the entire frequency range but that have faster rolloff to reduce the loss at band breaks. Let this filter be a length L FIR filter having taps given by h(n) for n=0, 1, 2, ..., L−1, which is defined to be zero elsewhere. Then the post-decimation whiteness property can be obtained by requiring that $$\sum_{n=0}^{L-1} h(n)h(n + 2k) = 0, \text{ for } k = \pm 1, \pm 2, \pm 3, \qquad (34)$$

This time-domain condition can be expressed by the equivalent frequency-domain condition described in Vetterli and Kovačević(M. Vetterli and J. Kovačević, *Wavelets and Subband Coding*. Prentice-Hall: Englewood Cliffs, 1995) of $$|H(\omega)|^2 + |H(\omega+\pi)|^2 = C, \qquad (35)$$

where H(ω) is the discrete-time Fourier transform of h(n) and C is an arbitrary constant; a filter that meets this condition is called a quadrature mirror filter (QMF). These filters play a major role in the theory and implementation of the wavelet transform, and any filter used to implement the lowpass filter used in the discrete orthogonal wavelet transform can be used here; in fact, the length-two filter used in (3) is a particular wavelet filter called the Haar filter.

Again, the advantage of using a more general QMF instead of the Haar filter used above is that they can be designed with faster rolloffs in the frequency domain and thus reduce the loss at band breaks in the filter bank; however, the price paid for this is additional computation, because a general QMF will have nonunity filter coefficients that will require multiplications that are avoided by using the filter of (3).

We now present the results of simulations executed to examine the performance of the techniques described above. For each test point, 200 realizations of (1) were computed at a specified frequency and a specified value of SNR; each of the 200 realizations consisted of a different random noise process as well as a different phase θ chosen randomly from a uniform distribution over [0, 2π). In each case, N=256 signal samples were generated and processed. For consistency between test points, each test point within a particular figure was computed using the same 200 realizations of (1); between figures, the realization sets differ. Each of the 200 realizations of (1) was processed using the techniques described above to arrive at 200 frequency estimates, $\hat{\omega}_o(r)$ for r=1, 2, 3, ..., 200. The mean-square error was computed using $$MSE = \frac{1}{200} \sum_{r=1}^{200} [\omega_o - \hat{\omega}_o(r)]^2; \qquad (36)$$

instead of plotting the MSE it is common to plot the inverse MSE in decibels, i.e., −10log$_{10}$(MSE)

FIG. 7 shows the results from simulating the four-channel method described above and compares them to the results from simulating the method of Kay and the method of Djuric and Kay. The plots in FIG. 7 show the performance of the methods over a range of SNR values on the horizontal axis and a range of frequency values between 0 and π radians/sample on the vertical axis; the contours show the resulting inverse MSE in decibels, where the right-most contour represents an inverse MSE of 100 dB and each subsequent contour to the left decreases the inverse MSE by 5 dB. The simulation results were essentially symmetric in frequency around 0 so only the results for positive frequencies are shown. The threshold is evident by close spacing of the contours, which indicates a rapid decrease in inverse MSE as SNR decreases. FIG. 7A shows the performance of Kay's method, where it is evident that the threshold is higher for frequencies near the edges of the frequency range. FIG. 7B shows the performance of Djuric and Kay's method, where it is evident that the threshold is fairly invariant of frequency and is at about the same SNR as for the center frequencies in FIG. 7A. FIG. 7C shows the performance of the four-channel method of the invention when operated without decimation while FIG. 7D shows the performance of the four-channel method when operated with decimation; the performance of these two cases is roughly the same, establishing that there is no performance loss due to the decimation.

The results in FIG. 7 show that the four-channel method, even with decimation, achieves a frequency-invariant threshold that is lower than the thresholds of Kay's method and Djuric and Kay's method.

The results from simulating the cascade method described above are compared to the results from simulating Kay's method in FIG. 8. As in FIG. 7, the plots in FIG. 8 show the performance of the methods over a range of SNR values and a range of frequency values; the contours show the resulting inverse MSE in decibels, where the right-most contour represents an inverse MSE of 100 dB and each subsequent contour to the left decreases the inverse MSE by 5 dB. FIG. 8A again shows the performance of Kay's method, but for a different set of 200 realizations of (1). FIG. 8B shows the results for p=1 (i.e., the four-channel case); FIG. 8C shows the results for p=2 (i.e., the 16-channel case); FIG. 8D shows the results for p=3 (i.e., the 64-channel case). For all three values of p we see a frequency-independent threshold, with the threshold decreasing with increasing p. For p=1 we again have the four-channel case presented in FIG. 7D, except for a different set of 200 realizations of (1), and the performance is similar to that shown FIG. 7. Also, FIG. 8 shows that as p increases, the threshold approaches what could be expected from the MLE approach described in Rife and Boorstyn. Furthermore, this indicates that lower thresholds can be achieved as the number of samples N increases, since larger N allows more stages of cascade.

Figure 9:
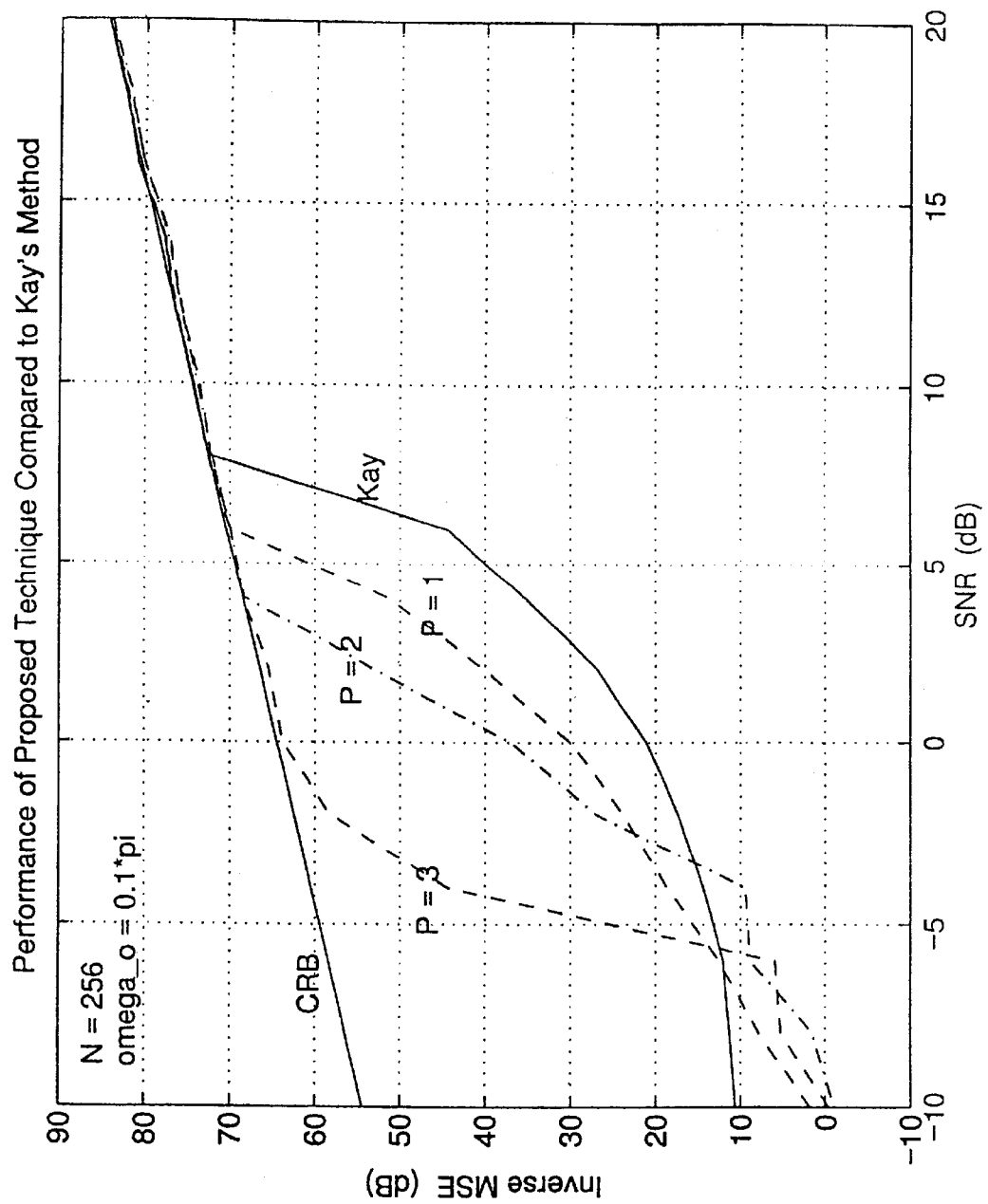
FIG. 9 is a graph showing simulation results of the cascaded filter bank method compared to the simulation results obtained using Kay's method and the Cramer-Rao bound (CRB) at a particular frequency of $\omega_o=0.1\pi$ radians/sample.

For the methods shown in FIGS. 7 and 8 the performance attains the CRB when the SNR is above the threshold; this is illustrated for a specific frequency in FIG. 9. The results in FIG. 9 can be thought of as a slice through the surface represented by the contours in FIG. 8 (where the slice is taken at $\omega_o=0.1\pi$), although the 200 realizations of (1) used in FIG. 9 are different than those used in FIG. 8. The results in FIG. 9 show the improvement in threshold with increasing p and demonstrate that the CRB is attained when the SNR is above the threshold for each case.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method for estimating the frequency of complex sinusoidal signals in the presence of noise, comprising the steps of:
    filtering and decimating a received input signal through a multichannel filter bank, said filter bank having a plurality of channels and one or more stages;
    applying outputs of said filter bank as inputs to a detector, each said output being a channel, said detector determining which of said outputs contains said sinusoidal signals and selecting one or more of said outputs, each said selected output corresponding to a respective one of said sinusoidal signals;
    computing phase differences for one or more said selected outputs; and
    estimating frequencies for said respective sinusoidal signals from said phase differences.

2. The method of claim 1, wherein said step of computing phase differences uses intermediate results computed by said detector.

3. The method of claim 1, wherein said multichannel filter bank is comprised of one or more four channel filter banks (FCFBs) applying 2× decimation and arranged in p stages, wherein the $n^{th}$ stage consists of $4^{(n-1)}$ FCFBs arranged in parallel to have $4^{(n-1)}$ inputs and $4^n$ outputs, and wherein the initial stage uses said received signal as input and each subsequent nth stage uses the outputs of a prior $(n-1)^{th}$ stage as said subsequent $n^{th}$ stage inputs.

4. The method of claim 3, wherein for each FCFB each of four signals is applied to a filter, said four signals comprising said FCFB input signal and three additional signals created by digitally heterodyning said FCFB input signal with complex sinusoids having N samples and having frequencies of $\pi$ radians per sample, $-\pi/2$ radians per sample and $+\pi/2$ radians per sample, respectively.

5. The method of claim 4, wherein said filter is a two-tap finite impulse response filter.

6. The method of claim 4, wherein said filter is a quadrature mirror filter.

7. The method of claim 1, wherein said detector is applied after each said stage to select one channel from said detector inputs.

8. The method of claim 7, wherein said multichannel filter bank is comprised of one four channel filter bank (FCFB) for each stage, each said filter bank applying 2× decimation, wherein the initial stage uses said received signal as input and each subsequent stage uses an output from the prior detector as input, and wherein for each FCFB each of four signals is applied to a filter, said four signals comprising said FCFB input signal and three additional signals created by digitally heterodyning said FCFB input signal with complex sinusoids having N samples and having frequencies of $\pi$ radians per sample, $-\pi/2$ radians per sample and $+\pi/2$ radians per sample, respectively.

9. The method of claim 8, wherein said filter is a two-tap finite impulse response filter.

10. The method of claim 8, wherein said filter is a quadrature mirror filter.

11. The method of claim 1, wherein said detector is applied after a last of said stages to select $M \geq 1$ channels having the largest statistics computed by said detector.

12. The method of claim 11, wherein the number of said stages is determined by the number N of samples of said sinusoidal signals.

13. The method of claim 11, wherein said value of M is specified a priori.

14. The method of claim 11, wherein said value of M is determined as a number of channels having a statistic computed by said detector above a threshold.

15. The method of claim 1, wherein for a first number R of stages said detector is applied after the Rth stage to select one channel from said detector inputs from said Rth stage, and wherein for a second number S of stages said detector is applied after each stage to select one channel from said detector inputs from a prior stage of said second number S of stages.

16. The method of claim 15, wherein first number R and second number S are determined by a number N of samples of said sinusoidal signals.

17. An apparatus for estimating the frequency of complex sinusoidal signals in the presence of noise, comprising:
    means for filtering and decimating a received input signal through a multichannel filter bank, said filter bank having a plurality of channels and one or more stages;
    means for applying outputs of said filter bank as inputs to a detector, each said output being a channel, said detector determining which of said outputs contains said sinusoidal signals and selecting one or more of said outputs, each said selected output corresponding to a respective one of said sinusoidal signals;
    means for computing phase differences for one or more said selected outputs; and
    means for estimating frequencies for said respective sinusoidal signals from said phase differences.

18. The apparatus of claim 17, wherein said means for computing phase differences uses intermediate results computed by said detector.

19. The apparatus of claim 17, wherein said multichannel filter bank is comprised of one or more four channel filter banks (FCFBs) applying 2× decimation and arranged in p stages, wherein the $n^{th}$ stage consists of $4^{(n-1)}$ FCFBs arranged in parallel to have $4^{(n-1)}$ inputs and $4^n$ outputs, and wherein the initial stage uses said received signal as input and each subsequent $n^{th}$ stage uses the outputs of a prior $(n-1)^{th}$ stage as said subsequent $n^{th}$ stage inputs.

20. The apparatus of claim 19, wherein for each FCFB each of four signals is applied to a filter, said four signals comprising said FCFB input signal and three additional signals created by digitally heterodyning said FCFB input signal with complex sinusoids having N samples and having frequencies of $\pi$ radians per sample, $-\pi/2$ radians per sample and $+\pi/2$ radians per sample, respectively.

21. The apparatus of claim 20, wherein said filter is a two-tap finite impulse response filter.

22. The apparatus of claim 20, wherein said filter is a quadrature mirror filter.

23. The apparatus of claim 17, wherein said detector is applied after each said stage to select one channel from said detector inputs.

24. The apparatus of claim 23, wherein said multichannel filter bank is comprised of one four channel filter bank (FCFB) for each stage, each said filter bank applying 2× decimation, wherein the initial stage uses said received signal as input and each subsequent stage uses an output from the prior detector as input, and wherein for each FCFB each of four signals is applied to a filter, said four signals comprising said FCFB input signal and three additional signals created by digitally heterodyning said FCFB input signal with complex sinusoids having N samples and having frequencies of $\pi$ radians per sample, $-\pi/2$ radians per sample and $+\pi/2$ radians per sample, respectively.

25. The apparatus of claim 24, wherein said filter is a two-tap finite impulse response filter.

26. The apparatus of claim 24, wherein said filter is a quadrature mirror filter.

27. The apparatus of claim 17, wherein said detector is applied after a last of said stages to select $M \geq 1$ channels having the largest statistics computed by said detector.

28. The apparatus of claim 27, wherein the number of said stages is determined by the number N of samples of said sinusoidal signals.

29. The apparatus of claim 27, wherein said value of M is specified a priori.

30. The apparatus of claim 27, wherein said value of M is determined as a number of channels having a statistic computed by said detector above a threshold.

31. The apparatus of claim 17, wherein for a first number R of stages said detector is applied after the Rth stage to select one channel from said detector inputs from said Rth stage, and wherein for a second number S of stages said detector is applied after each stage to select one channel from said detector inputs from a prior stage of said second number S of stages.

32. The apparatus of claim 31, wherein first number R and second number S are determined by a number N of samples of said sinusoidal signals.

33. A program storage device readable by a machine, tangibly embodying a program of instructions executable by said machine to perform method steps for estimating the frequency of complex sinusoidal signals in the presence of noise, said method steps comprising:

filtering and decimating a received input signal through a multichannel filter bank, said filter bank having a plurality of channels and one or more stages;

applying outputs of said filter bank as inputs to a detector, each said output being a channel, said detector determining which of said outputs contains said sinusoidal signals and selecting one or more of said outputs, each said selected output corresponding to a respective one of said sinusoidal signals;

computing phase differences for one or more said selected outputs; and estimating frequencies for said respective sinusoidal signals from said phase differences.

* * * * *